(12) United States Patent
Asaishi

(10) Patent No.: US 7,477,356 B2
(45) Date of Patent: Jan. 13, 2009

(54) EXPOSURE APPARATUS

(75) Inventor: Tadahiro Asaishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/759,344

(22) Filed: Jun. 7, 2007

(65) Prior Publication Data

US 2007/0285646 A1 Dec. 13, 2007

(30) Foreign Application Priority Data

Jun. 9, 2006 (JP) .............................. 2006-161640

(51) Int. Cl.
G03B 27/72 (2006.01)
G03B 27/42 (2006.01)
(52) U.S. Cl. .......................................... 355/69; 355/53
(58) Field of Classification Search .................. 355/53, 355/55, 67–71; 250/548; 356/399–401; 372/20, 25
See application file for complete search history.

(56) References Cited

U.S. PATENT DOCUMENTS

| 4,869,999 | A | 9/1989 | Fukuda et al. |
| 4,904,569 | A | 2/1990 | Fukuda et al. |
| 4,937,619 | A | 6/1990 | Fukuda et al. |
| 4,992,825 | A | 2/1991 | Fukuda et al. |
| 5,097,291 | A * | 3/1992 | Suzuki .......................... 355/69 |
| 5,661,547 | A * | 8/1997 | Aketagawa et al. ............ 355/53 |
| RE36,731 | E | 6/2000 | Fukuda et al. |
| 6,853,653 | B2 * | 2/2005 | Spangler et al. ................ 372/20 |
| 6,862,079 | B2 | 3/2005 | Sato .............................. 355/69 |
| 6,882,407 | B2 | 4/2005 | Asaishi ......................... 355/68 |
| 2005/0190801 | A1 | 9/2005 | Sukegawa et al. .............. 372/20 |
| 2006/0017051 | A1 | 1/2006 | Asaishi ......................... 257/48 |

FOREIGN PATENT DOCUMENTS

| JP | 1-077123 | 3/1989 |
| JP | 7-058393 | 3/1995 |
| JP | 7-58393 | 3/1995 |

(Continued)

OTHER PUBLICATIONS

Japanese Office Action dated Apr. 11, 2008, issued in corresponding Japanese patent application No. 2006-161640.

(Continued)

*Primary Examiner*—Hung Henry Nguyen
(74) *Attorney, Agent, or Firm*—Fitzpatrick, Cella, Harper & Scinto

(57) ABSTRACT

An exposure apparatus for performing exposure of an object to light. A measuring device measures a wavelength spectrum of the light. A processor calculates a center wavelength of light based on the measured wavelength spectrum, and a main controller determines whether the exposure is to be performed, based on the calculated center wavelength of the light. The wavelength spectrum includes a first spectral component and a second spectral component, and the processor calculates the center wavelength of the light $\lambda 0$ in accordance with:

$$\lambda 0 = \lambda 0\text{-}1 + \Delta\lambda \times (\Delta\lambda\_A/(\Delta\lambda\_A + \Delta\lambda\_B)), \text{ and}$$

$$\Delta\lambda\_A : \Delta\lambda\_B = \text{Energy-2} : \text{Energy-1},$$

where $\lambda 0\text{-}1$ is a center wavelength of the first spectral component, $\lambda 0\text{-}2$ ($\lambda 0\text{-}2 > \lambda 0\text{-}1$) is a center wavelength of the second spectral component, Energy-1 is a peak light intensity of the first spectral component, Energy-2 is a peak light intensity of the second spectral component, and $\Delta\lambda = \lambda 0\text{-}2 - \lambda 0\text{-}1$.

4 Claims, 9 Drawing Sheets

FOREIGN PATENT DOCUMENTS

| | | |
|---|---|---|
| JP | 2619473 B2 | 3/1997 |
| JP | 9-180984 | 7/1997 |
| JP | 11-162824 | 6/1999 |
| JP | 2003-152256 | 5/2003 |
| JP | 2004-271498 | 9/2004 |
| JP | 2005-191503 | 7/2005 |
| JP | 2007-005538 | 1/2007 |
| WO | WO 2005/046011 A2 | 5/2005 |

OTHER PUBLICATIONS

Korean Office Action dated Apr. 18, 2008, issued in corresponding Korean patent application No. 10-2007-0055038.

English translation of Japanese Office Action dated Apr. 11, 2008, issued in corresponding Japanese patent application No. 2006-161640.*

* cited by examiner

EXPOSURE APPARATUS

This application claims the benefit of Japanese Patent Application No. 2006-161640, filed Jun. 9, 2006, which is hereby incorporated by reference herein in its entirety.

BACKGROUND OF THE INVENTION

1. Field of the Invention

The present invention relates to an exposure apparatus.

2. Description of the Related Art

Lithography is a well-known technique for forming a predetermined circuit pattern on a semiconductor. Lithography includes a step of forming a latent image pattern by irradiating a substrate coated with a photosensitive agent (photoresist) with light via a reticle to expose the photosensitive agent, and, thereafter, developing the photosensitive agent. Development forms a mask pattern for use in, e.g., etching.

As indicated by equation (1), the resolution of the exposure apparatus is known to be proportional to a wavelength $\lambda$ of a light source and inversely proportional to a numerical aperture NA of a projection lens.

$$\text{Resolution} = k1 \cdot (\lambda/\text{NA}) \quad (1)$$

where k1 is a proportionality constant.

To improve the resolution of the exposure apparatus, it is only necessary to shorten the wavelength of the light source or to increase the numerical aperture of the projection lens.

One of the characteristic features of an optical system of the exposure apparatus is the depth of focus (DOF). The DOF is the allowable blurring range of a projected image, which is expressed by the distance from the focus point. The DOF is given by:

$$\text{DOF} = k2 \cdot (\lambda/\text{NA}^2) \quad (2)$$

where k2 is a proportionality constant.

As the wavelength of the light source shortens or the numerical aperture of the projection lens increases, to improve the resolution of the exposure apparatus, the DOF noticeably decreases. This shortens a distance, in the optical axis direction, in which accurate processing is possible.

Especially, next-generation devices aiming at an increase in the degree of integration by forming a finer, stereoscopic circuit pattern are facing a serious problem of such a decrease in the DOF. This is because a wide range of sharp focus is necessary, since the formation of a stereoscopic circuit pattern elongates the processing dimension in the optical axis direction and a given DOF is always necessary irrespective of the degree of micropatterning of the circuit.

To solve the above problem, an attempt to increase the DOF is made by projecting the pattern of the reticle onto the substrate using exposure light, including a plurality of wavelengths, to form images at different positions on the same optical axis.

For example, Japanese Patent No. 02-619473 proposes an exposure method of using, as an exposure light beam, the light obtained by synthesizing the light beams from both a light source, which emits the first wavelength light and a light source, which emits the second wavelength light.

Japanese Patent Laid-Open No. 11-162824 proposes a method of performing exposure with exposure light, including a plurality of wavelengths, by inserting, on the light path between the light source and the wafer, a filter, which selectively transmits light in a plurality of wavelength ranges.

The current exposure apparatus must stabilize the light quality of the light source at the time of exposure and its calibration.

FIG. 1 shows the spectral shape of light (single-wavelength light) emitted by the light source. The abscissa represents a light wavelength $\lambda$, and the ordinate represents the light intensity as a function of the wavelength $\lambda$.

As shown in FIG. 1, the current exposure apparatus employs a central wavelength $\lambda 0$, FWHM (Full Width Half Maximum), and an E95 value as evaluation indices of the light quality. The FWHM indicates a bandwidth measured at an intensity at half of the peak intensity. The E95 value indicates a bandwidth in which 95% of the entire spectral energy is concentrated.

The exposure apparatus monitors the central wavelength $\lambda 0$, FWHM, and E95 value immediately before exposure or during exposure to calculate a variation ($3\sigma$) in measurement values and an error value (an error with respect to a command value), thereby confirming the stability of the light quality.

Even exposure using exposure light including a plurality of wavelengths requires stabilization of the light quality at the time of exposure and calibration of the exposure apparatus.

However, light including a plurality of wavelengths exhibits a spectrum, such as that shown in FIG. 2. Even when the central wavelength $\lambda 0$, FWHM, and E95 value as conventional indices are calculated for the entire spectrum of light including a plurality of wavelengths, it is impossible to sufficiently confirm the light quality based on these indices.

For example, when the pattern of the reticle is projected onto the wafer with light including two peaks, as shown in FIG. 2, an adverse effect, such as image blurring, occurs. To prevent this problem, a difference Ediff between the peak intensities should also be controlled/monitored during exposure.

SUMMARY OF THE INVENTION

The present invention has been made in consideration of the above background, and has as its exemplary object to provide a novel technique for determining whether an object is to be exposed to light, based on a wavelength spectrum of the light.

According to a first aspect of the present invention, there is provided an exposure apparatus for performing exposure of an object to light. The apparatus comprises a measuring device configured to measure a wavelength spectrum of the light, a processor configured to calculate a central wavelength of the light based on the measured spectrum, and a main controller. The processor is configured to obtain a central wavelength of each of a plurality of components of the measured spectrum and a light intensity corresponding to each of the plurality of components, and to calculate the central wavelength of the light based on the obtained central wavelengths and the obtained light intensities. The main controller is configured to determine whether the exposure is to be performed, based on the calculated central wavelength of the light.

According to a second aspect of the present invention, there is provided an exposure apparatus for performing exposure of an object to light. The apparatus comprises a measuring device configured to measure a wavelength spectrum of the light, a processor configured to calculate a central wavelength of the light based on the measured spectrum, and a main controller. The processor is configured to accumulate the measured wavelength spectrum in order of wavelengths of the light, and to calculate, as the central wavelength of the light, a wavelength at which the accumulated value is half the maximum accumulated value. The main controller is configured to determine whether the exposure is to be performed, based on the calculated central wavelength of the light.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings.

Figure 4:
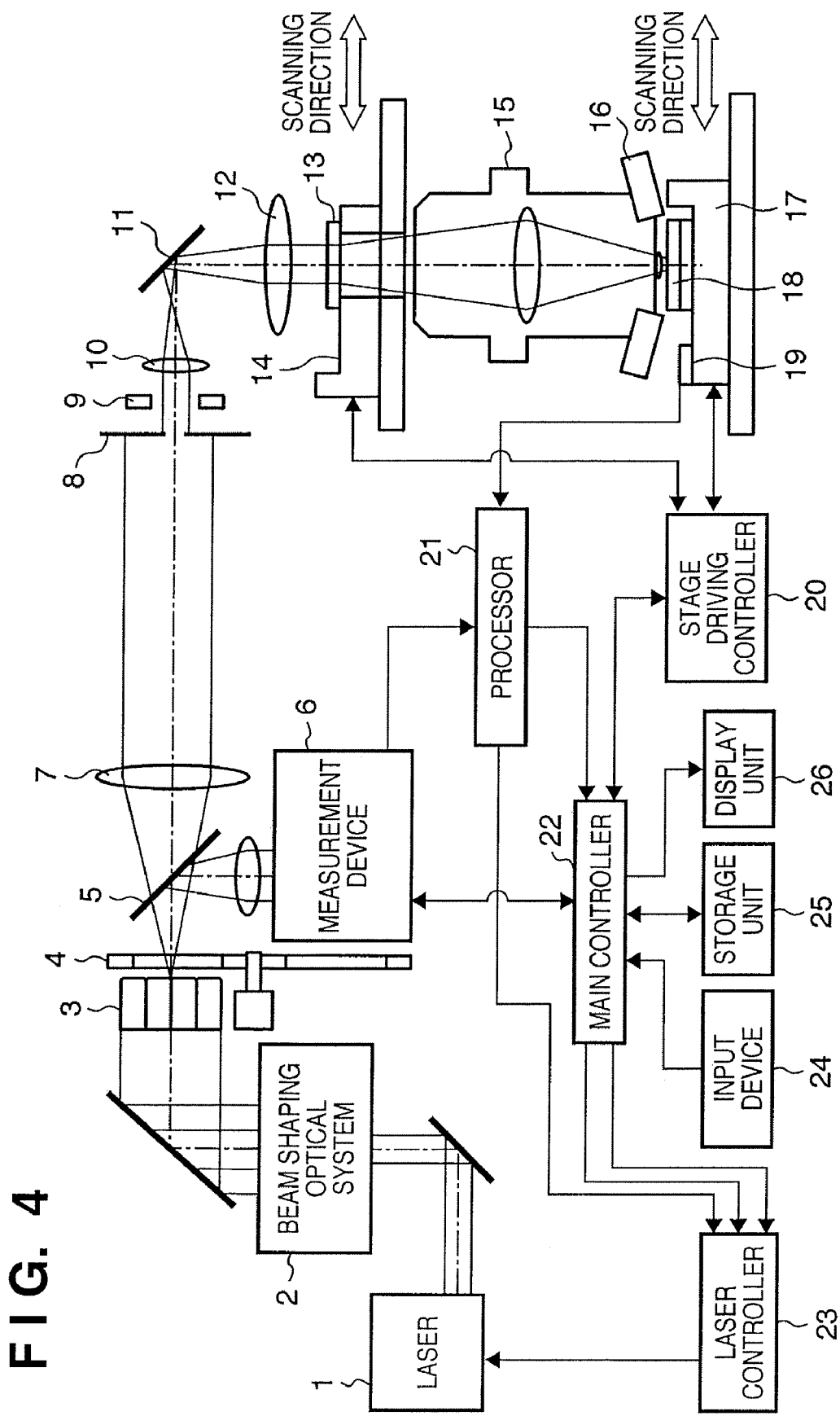
FIG. 4 is a diagram showing the schematic arrangement of an exposure apparatus according to a preferred embodiment of the present invention.

FIG. 4 is a diagram showing the schematic arrangement of an exposure apparatus according to a preferred embodiment of the present invention. In this embodiment, the exposure apparatus is configured as a scanning exposure apparatus.

Referring to FIG. 4, a light source (laser) 1 emits light including a plurality of components of a spectrum respectively having peaks at different wavelengths. In this specification, components of a spectrum indicate individual mountain-shaped portions which constitute the spectrum. For example, the spectrum of light having peaks at two wavelengths includes two components of the spectrum. The light source 1 typically generates pulse light (pulsed light).

Light emitted by the light source (laser) 1 is formed into a predetermined shape through a beam shaping optical system 2. The shaped light enters the incident surface of an optical integrator 3. The optical integrator 3 comprises a plurality of microlenses and forms a large number of secondary sources near its exit surface.

A stop turret 4 is arranged on the exit surface side of the optical integrator 3. Stops buried in the stop turret 4 regulate the size of a secondary source plane formed by the optical integrator 3. A plurality of stops to which illumination mode numbers are assigned are buried in the stop turret 4. Stops necessary for changing the shape of an incident light source of illumination light are selected and inserted in the light path. Such stops can include, e.g., quadrupole stops, ring-like stops for annular illumination, and apertures stops which have different circular aperture areas and serve to set a plurality of coherence factors σ.

A first measuring device 6 measures the spectrum of light reflected by a half mirror 5 and removed from the light path, and sends the measured spectrum to a processor 21.

A condenser lens 7 Koehler-illuminates a blind 8 with the light beam from the secondary source near the exit surface of the optical integrator 3. A slit member 9 is arranged near the blind 8 to form the profile of slit light, which illuminates the blind 8 into a rectangle or an arc. In a state wherein the illuminance and incident angle are made uniform, the slit light forms an image via a condenser lens 10 and mirror 11 on a reticle 13, which is placed on a conjugate plane of the blind 8 and on which an element pattern is formed. The opening area of the blind 8 has a figure similar to that of the pattern exposure area of the reticle (original) 13 at an optical magnification ratio. At the time of exposure, the blind 8 synchronously scans a reticle stage 14 and the reticle 13 at the optical magnification ratio while shielding areas other than the exposure area of the reticle 13.

The reticle stage (original stage) 14 holds the reticle 13. The slit light having passed through the reticle 13 passes through a projection optical system 15 and is imaged again as slit light in the exposure field angle area of a plane (imaging plane) optically conjugate to the pattern surface of the reticle 13. A focus detection system 16 detects the height and inclination of the exposed surface on a wafer 18 held by a wafer stage (substrate stage) 17. In scanning exposure, the wafer (substrate) 18 is exposed with the slit light to form a latent image pattern on the photosensitive agent on the wafer 18, while the reticle stage 14 and wafer stage 17 travel in synchronism with each other. At this time, the wafer stage 17 is driven based on information sent from the focus detection system 16, such that the exposed surface of the wafer 18 coincides with the imaging plane.

A second measuring device 19 is arranged on the wafer stage 17. The second measuring device 19 measures the spectrum of slit light within the exposure field angle, and sends the measured spectrum to the processor 21.

A stage driving controller 20 controls the reticle stage 14 and wafer stage 17. At the time of scanning exposure, the stage driving controller 20 allows the reticle stage 14 and the wafer stage 17 to travel in synchronism with each other while controlling the position of the exposed surface (wafer plane).

A processor 21 calculates a light amount based on the spectra measured by the first measuring device 6 and second measuring device 19. The first measuring device 6 measures a spectrum during wafer exposure. The second measuring device 19 measures the spectrum of the slit light, with which the wafer 18 is irradiated, before an exposure step. Before the exposure step, the processor 21 calculates the correlation between the light amount obtained by the spectrum measured by the first measuring device 6 and the light amount obtained by the spectrum measured by the second measuring device 19. During the exposure step, the processor 21 converts, using the resultant correlation, the light amount obtained by the spectrum measured by the first measuring device 6 into a light amount on the wafer 18. The processor 21 sends the converted light amount as a monitor light amount for exposure amount control to a main controller 22.

A laser controller 23 outputs a trigger signal and an applied voltage signal in accordance with the target pulse light amount to control the oscillation frequency and to output energy of the light source (laser) 1. The laser controller 23 generates a trigger signal and an applied voltage signal based on a pulse light amount signal from the processor 21 and an exposure parameter from the main controller 22.

The main controller 22 receives an exposure parameter (e.g., the integrated exposure amount, necessary integrated exposure amount accuracy, or stop shape) via an input device 24 serving as a man-machine interface or a media interface. A storage unit 25 stores the exposure parameter. A display unit 26 can display, e.g., the correlation between the light amounts obtained by the spectra measured by the first measuring device 6 and second measuring device 19.

The main controller 22 calculates parameters necessary for scanning exposure based on data given by the input device 24, parameters unique to the exposure apparatus, and data sent from measuring devices, such as the first measuring device 6 and second measuring device 19. The main controller 22 sends the calculated parameters to the laser controller 23 and stage driving controller 20.

Figure 5:
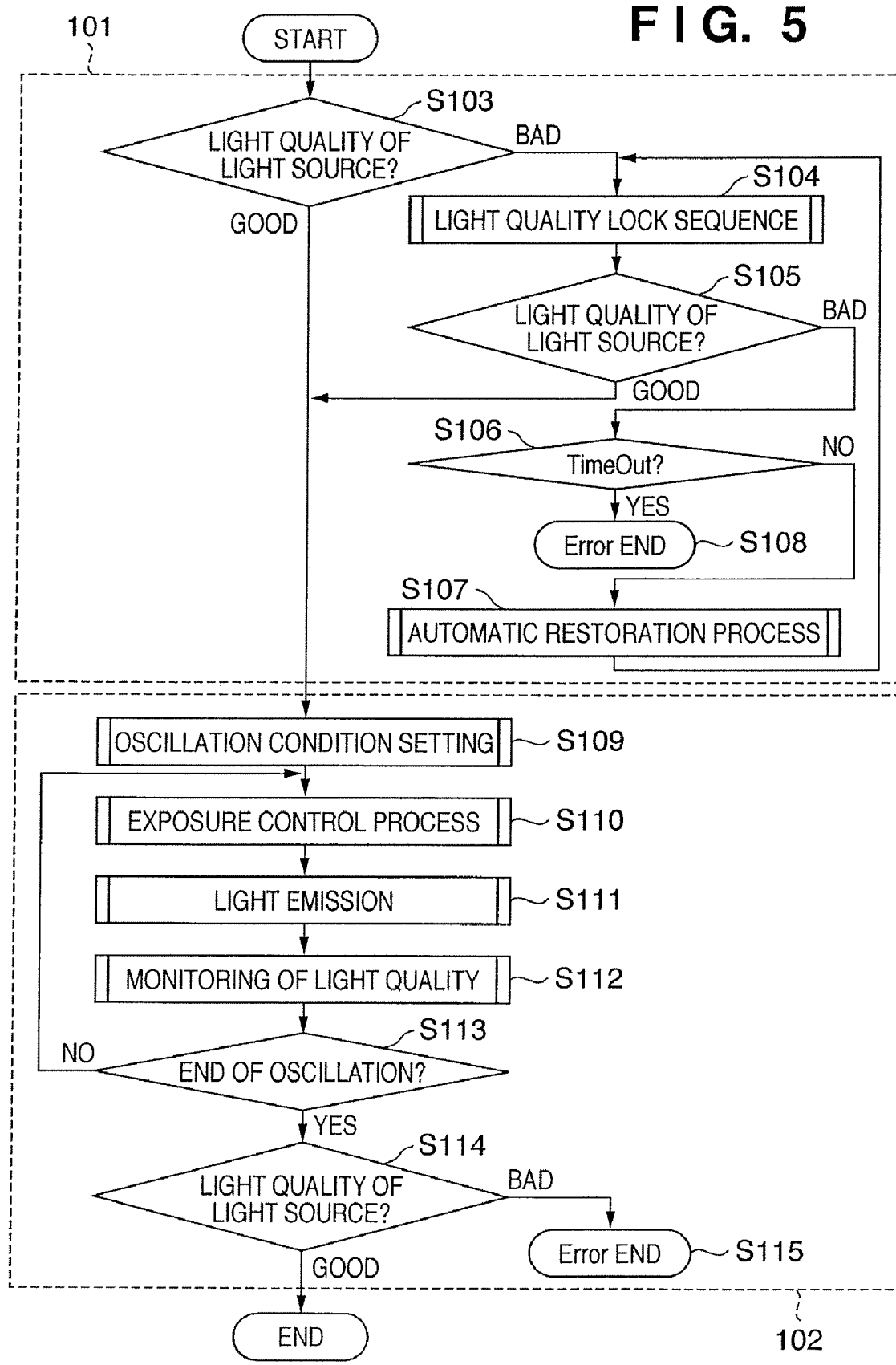
FIG. 5 is a flowchart illustrating a light quality lock sequence and an oscillation sequence.

FIG. 5 is a flowchart schematically illustrating a light quality lock sequence and an oscillation sequence controlled by the main controller 22. When transferring the pattern of the reticle onto the wafer by exposure or when calibrating the exposure apparatus in association with the light source 1, the exposure apparatus repeatedly executes a light quality lock sequence 101 and an oscillation sequence 102.

In the light quality lock sequence 101, the state of light quality (to be referred to as the light quality of the light source hereinafter) generated by the light source 1 is confirmed. If the light quality is in a BAD state (a state wherein the prescribed light quality performance cannot be guaranteed), the exposure apparatus performs an oscillation process for increasing the light quality to a required precision. The oscillation sequence 102 is a sequence for wafer exposure or calibration of the exposure apparatus.

In step 103, the light quality of the light source is confirmed. If the light quality is in a GOOD state (a state wherein the prescribed light quality performance can be guaranteed), the process shifts to the oscillation sequence 102. If the light quality is in a BAD state (a state wherein the prescribed light quality performance cannot be guaranteed), the process shifts to a light quality lock sequence 104.

Step 104 is a light quality lock sequence. In step 104, idle oscillation, which does not contribute to wafer exposure or apparatus calibration, is done, to stabilize the light quality.

In step 105, the light quality of the light source is confirmed. If the light quality is in a GOOD state (a state wherein the prescribed light quality performance can be guaranteed), the process shifts to the oscillation sequence 102. If the light quality is in a BAD state (a state wherein the prescribed light quality performance cannot be guaranteed), the process shifts to step 106.

It is determined in step 106 whether the number of times of execution of the light quality lock sequence 104 has exceeded a predetermined number of times. If the number of times of execution of the light quality lock sequence 104 has exceeded the predetermined number of times (YES in step 106), the process shifts to step 108. If the number of times of execution of the light quality lock sequence 104 is less than the predetermined number of times (NO in step 106), the light quality lock sequence 104 is performed again after an automatic restoration process 107.

Step 107 is an automatic restoration process. In step 107, the chamber gas mixture ratio, chamber gas pressure, and dispersion element (grating) of the light source 1 are adjusted again in accordance with the light quality of the light source 1 to improve the degraded light quality. If, for example, the width (FWHM or E95 value) of each component in the spectrum of light emitted by the light source 1 falls outside the specification, it is effective to adjust the $F_2$ gas concentration and gas pressure of the chamber of the light source 1 to attain a desired bandwidth.

If the central wavelength, such as the central wavelength λ0 or λ0-center shifts from the set value, it is effective to adjust the dispersion element (grating) to correct the wavelength shift amount.

Step 108 is an Error end step executed when an improvement in light quality fails even by the predetermined number of times of an automatic restoration process 107. In this case, light quality restoration requires hardware repairing (e.g., the replacement of the chamber of the light source). In this process, the operator is notified that hardware repair is necessary, and the exposure apparatus stops (no subsequent processes are executed).

Step 109 is an oscillation condition setting sequence. In step 109, the stage scan velocity, the light source oscillation frequency, the target energy, and the number of emission pulses are calculated in accordance with the set exposure amount to make settings to the stage driving controller 20 and laser controller 23.

Step 110 is an exposure control process sequence. In step 110, the output of light emitted by the light source 1 is detected based on the spectrum measured by the first measuring device 6, to calculate target energy necessary for the next emission pulse.

In step 111, the calculated target energy command value is set in the light source 1 to emit light.

In step 112, the light quality of the light source is monitored for each emitted pulse.

It is confirmed in step 113 whether the monitoring result meets an oscillation end condition (e.g., the number of emission pulses and the integrated value of oscillated energy). If the monitoring result meets the oscillation end condition (YES in step 113), the process shifts to step 114; otherwise (NO in step 113), the process returns to step 110 to continue the oscillation process.

In step 114, the light quality of the light source is confirmed. If the light quality is in a GOOD state (a state wherein the prescribed light quality performance can be guaranteed), the process normally ends. If the light quality is in a BAD state (a state wherein the prescribed light quality performance cannot be guaranteed), the process shifts to step 115.

A series of sequences may be changed so as to execute decision step 114 between steps 112 and 113. That is, decision step 114 may be executed for each emission pulse or after completing oscillation. Step 115 is an Error end step.

A method of evaluating the light quality of the light source according to the preferred embodiment of the present invention is suitable for the processes in steps 103, 105 and 114 of FIG. 5.

How to evaluate the light quality of light (light including a plurality of components of a spectrum respectively having peaks at different wavelengths) emitted by the light source 1, based on the spectrum of the light, will be exemplified below.

(Evaluation Method 1)

In evaluation method 1, the quality of light emitted by the light source 1 is evaluated based on the central wavelength of the light. It is possible to define the central wavelength of the light as a parameter calculated in consideration of the barycenter of the light intensity of each component of the spectrum of pulse light emitted by the light source 1.

Figure 6:
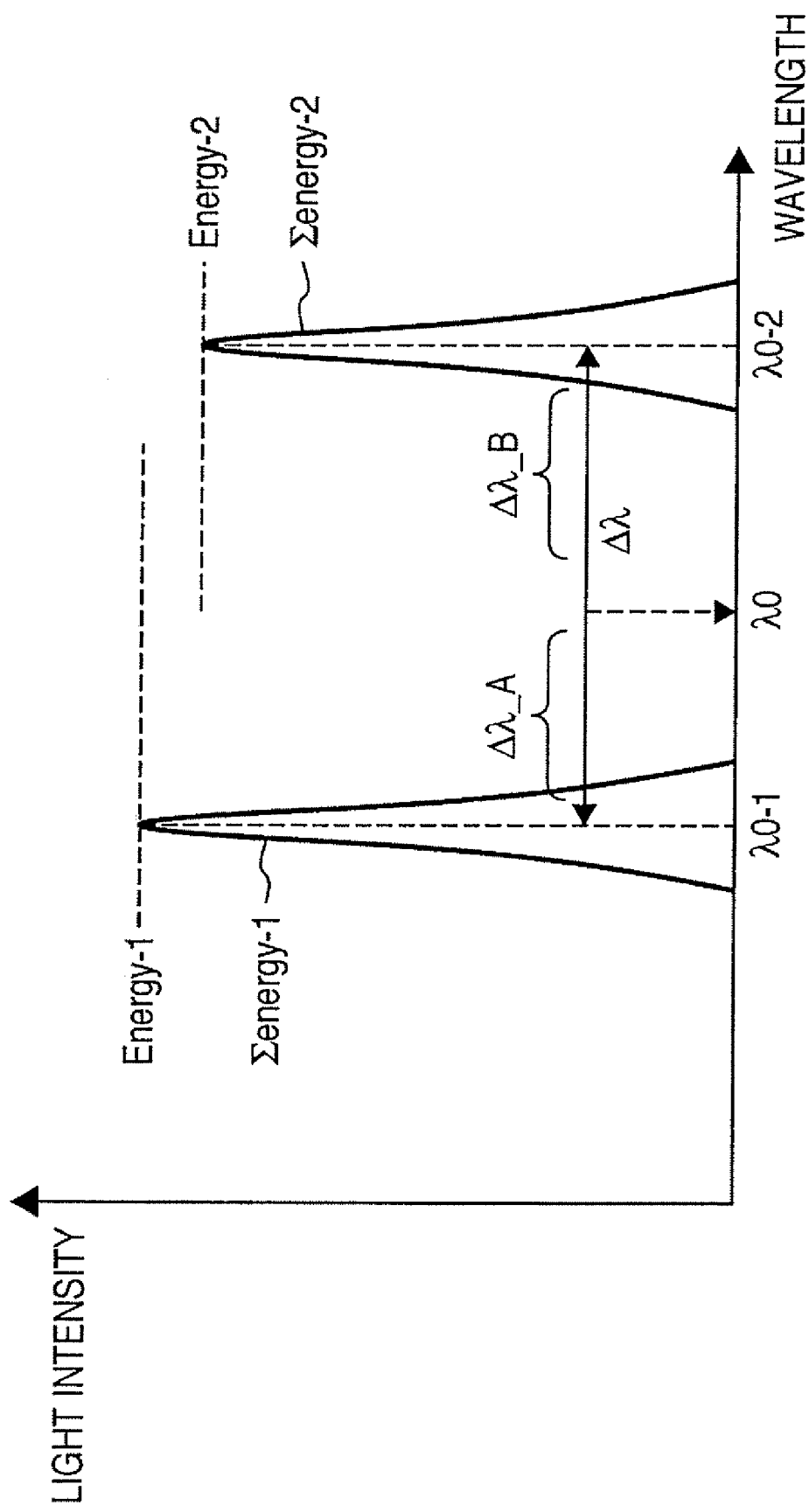
FIG. 6 is a graph showing a definition example of the central wavelength of light including a plurality of wavelengths.

Evaluation method 1 will be explained by taking a spectrum including two components (peaks) of the spectrum shown in FIG. 6 as an example. In the component of the spectrum on the short-wavelength side, λ0-1 indicates the central wavelength, Energy-1 indicates the peak light intensity, and Σenergy-1 indicates the sum total of the energy. In the component of the spectrum on the long-wavelength side, λ0-2 indicates the central wavelength, Energy-2 indicates the peak light intensity, and Σenergy-2 indicates the sum total of energy.

Δλ is represented by a difference λ0-2−λ0-1 between the central wavelengths of the two components of the spectrum. As indicated by equation (3), Δλ_A and Δλ_B are determined in accordance with the ratio between the peak light intensities of the two components of the spectrum or the ratio between the sum totals of energy of the two components of the spectrum. More specifically $\Delta\lambda\_A$ and $\Delta\lambda\_B$ are obtained by dividing the wavelength difference $\Delta\lambda$ n accordance with the ratio in equation (3) below:

$$\Delta\lambda\_A : \Delta\lambda\_B = \text{Energy-2} : \text{Energy-1} \text{ (or } \Sigma\text{energy-2}:\Sigma\text{energy-1)} \quad (3)$$

In this case, a central wavelength $\lambda 0$ of light emitted by the light source 1 is defined by:

$$\lambda 0 = \lambda 0\text{-}1 + \Delta\lambda \times (\Delta\lambda\_A/(\Delta\lambda\_A + \Delta\lambda\_B)) \quad (4)$$

Figure 7:
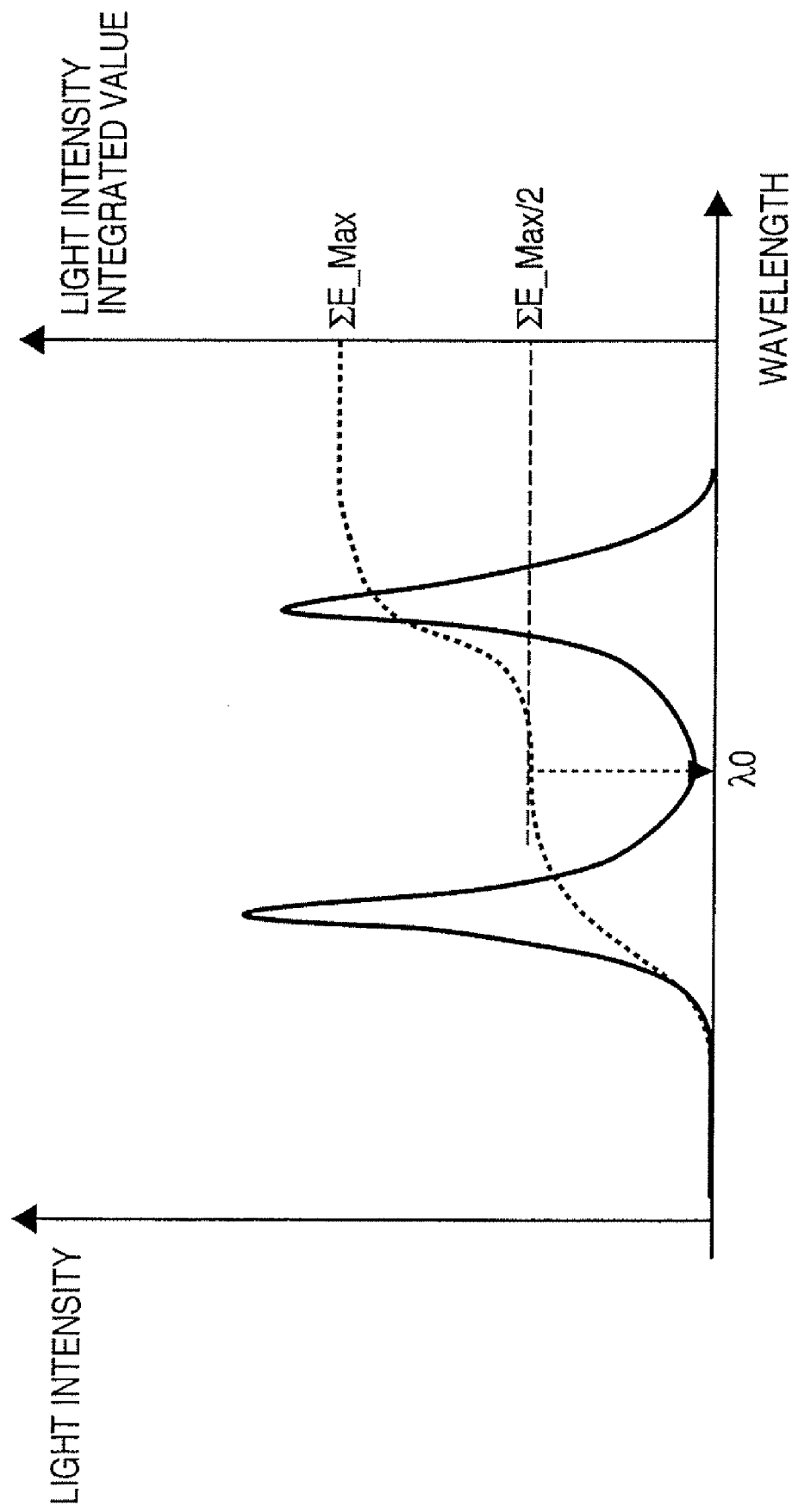
FIG. 7 is a graph showing another definition example of the central wavelength of light including a plurality of wavelengths.

Alternatively, as shown in FIG. 7, the processor 21 may integrate the light intensity of the spectrum of light including two components of the spectrum from the short-wavelength side (or long-wavelength side) to define, as a central wavelength $\lambda 0$, a wavelength at which the light intensity integrated value becomes half its maximum value.

The processor 21 calculates a central wavelength $\lambda 0$ based on a spectrum sent from each of the first measuring device 6 and/or the second measuring device 19, and sends the calculated central wavelength $\lambda 0$ to the main controller 22. The processor 21 can calculate the central wavelength $\lambda 0$ for each emission pulse.

The main controller (evaluation unit) 22 can confirm the light quality of the light source based on, e.g., the central wavelength $\lambda$ and/or a variation (e.g., $3\sigma$) in central wavelengths $\lambda 0$ between a plurality of pulses and/or an error value (an error of the central wavelength $\lambda 0$ with respect to a command value).

The storage unit 25 of the exposure apparatus can record in advance a threshold value to determine the parameter (central wavelength $\lambda 0$. In decision step 103, 105, or 113, the main controller (evaluation unit) 22 compares the parameter (the central wavelength $\lambda 0$, the variation in central wavelengths $\lambda 0$, or the error with respect to a command value) with the determination threshold value. If the monitoring result of the light quality does not satisfy the required precision recorded in the exposure apparatus, the Error end process (108 or 115 in FIG. 5) or automatic restoration process (107 in FIG. 5), or the light quality lock sequence (104 in FIG. 5), is executed.

(Evaluation Method 2)

In evaluation method 2, the quality of light emitted by the light source 1 is evaluated based on a value representing the correlation between the respective peak intensities of a plurality of components of the spectrum of light.

Figure 1:
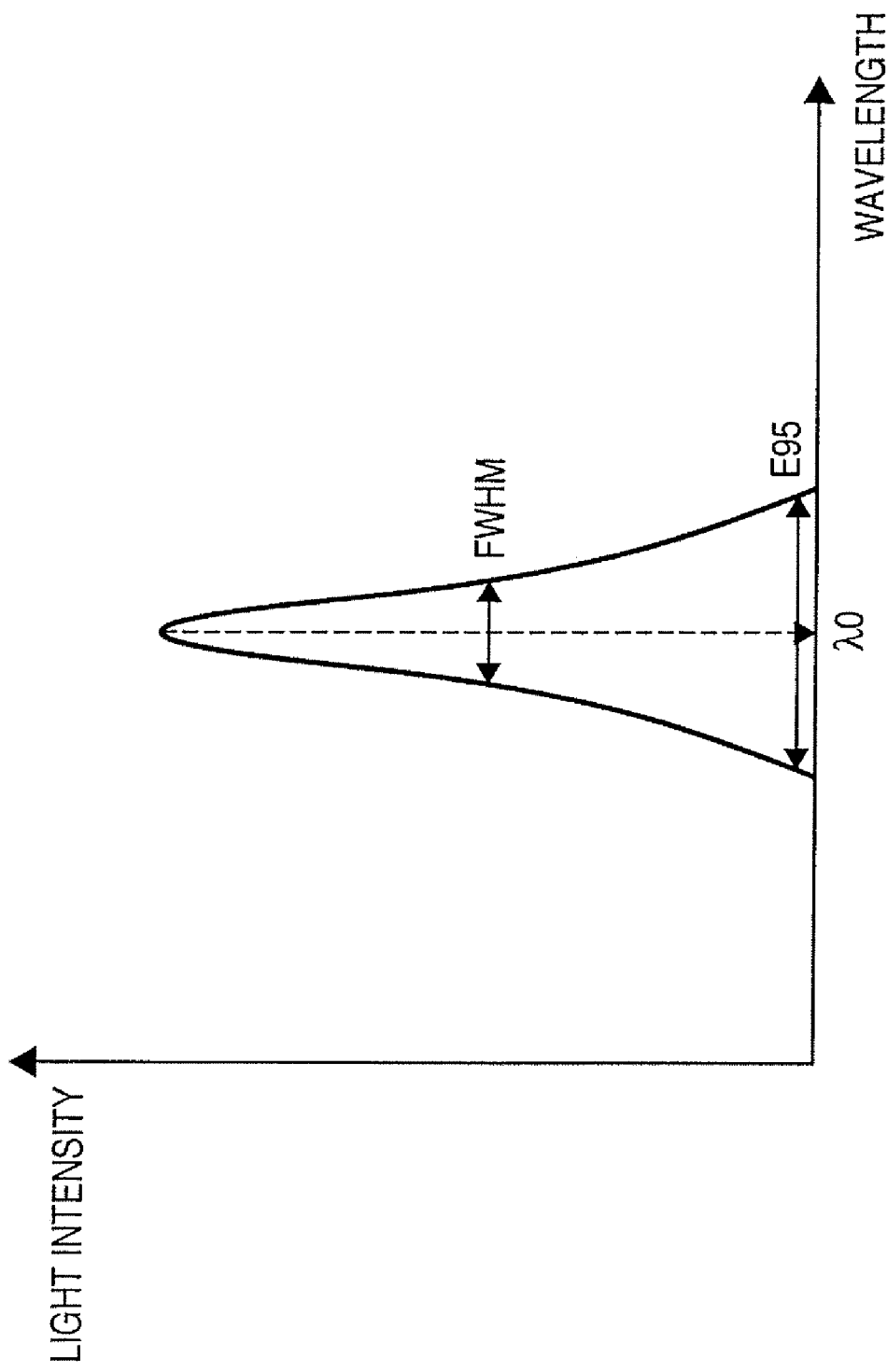
FIG. 1 is a graph showing an example of the spectrum of light including a single wavelength.
Figure 2:
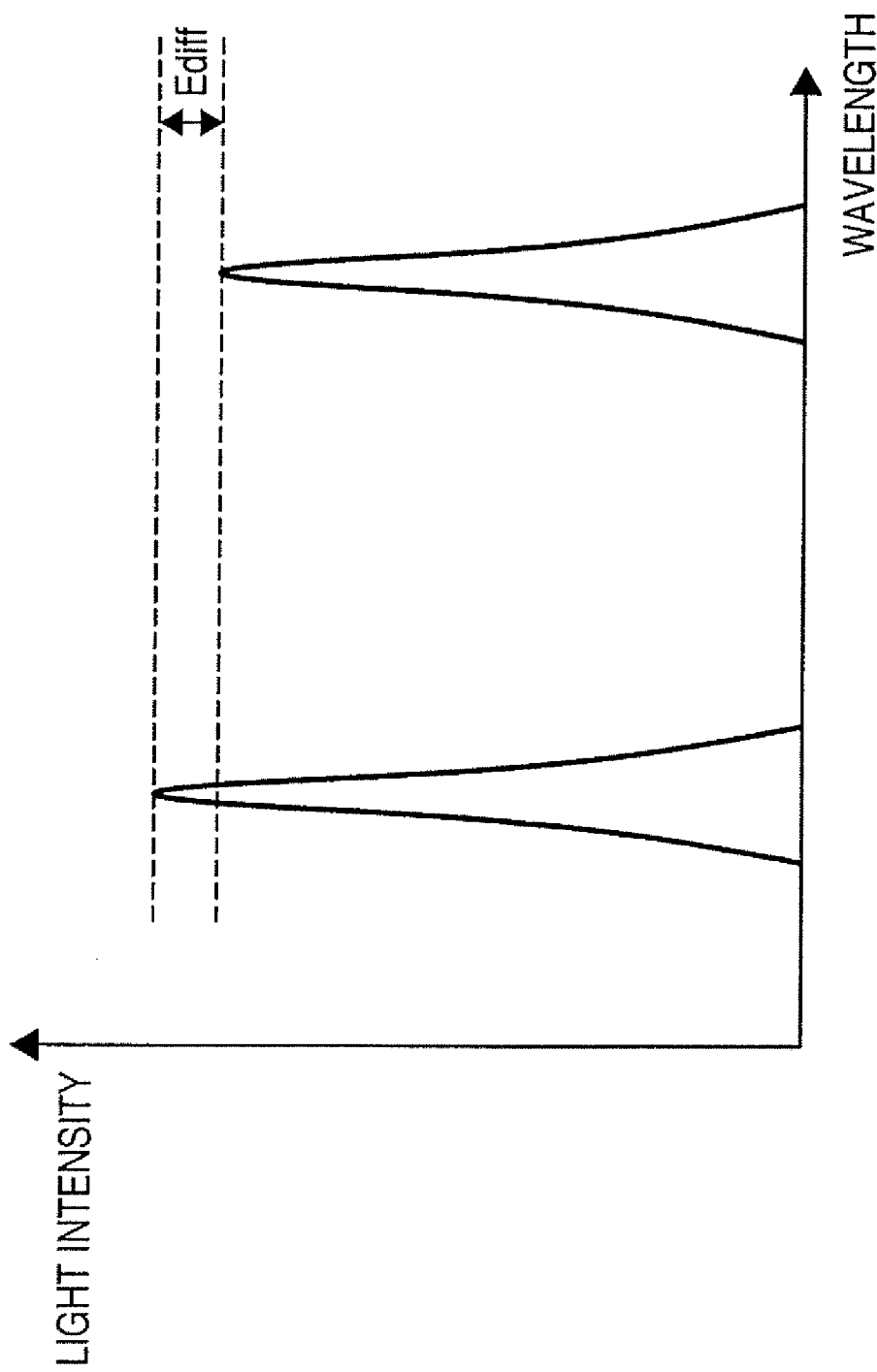
FIG. 2 is a graph showing an example of the spectrum of light including a plurality of wavelengths.
Figure 3:
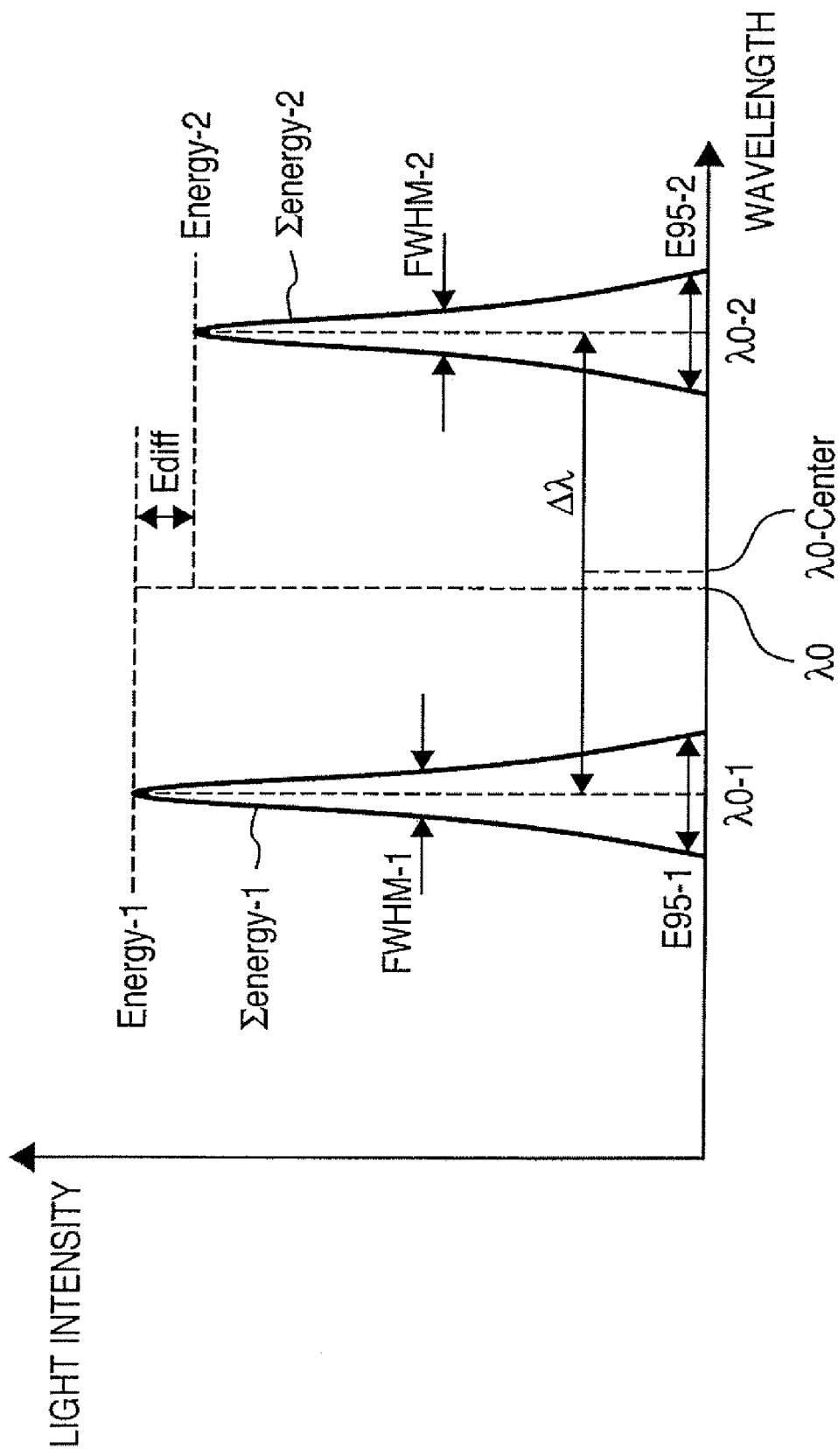
FIG. 3 is a graph for explaining light quality parameters of light including a plurality of wavelengths.

As illustrated in FIG. 3, in the spectrum of light including two components (peaks) of the spectrum, Energy-1 indicates the peak light intensity (maximum value) of the component of the spectrum on the short-wavelength side, and Energy-2 indicates the peak light intensity (maximum value) of the component of the spectrum on the long-wavelength side.

The processor 21 calculates a difference Ediff between the peak light intensities (light amounts or energy) of a plurality of components of a spectrum sent from each of the first measuring device 6 and/or second measuring device 19, and sends the calculated difference Ediff to the main controller 22. The difference Ediff is given by:

$$E\text{diff} = |\text{Energy-1} - \text{Energy-2}|. \quad (5)$$

The processor 21 may calculate a ratio ER between the peak light intensities of two components of a spectrum sent from each of the first measuring device 6 and/or second measuring device 19, and send the calculated ratio ER to the main controller 22. The ratio ER is given by:

$$ER32 \text{ Energy-1/Energy-2}. \quad (6)$$

The processor 21 can calculate the difference Ediff or ratio ER for each emission pulse.

The main controller 22 can confirm the light quality of the light source based on, e.g., the difference Ediff and/or a variation (e.g., $3\sigma$) in differences Ediff between a plurality of pulses and/or an error value (an error of the difference Ediff with respect to a command value). Alternatively, the main controller 22 can confirm the light quality of the light source based on, e.g., the ratio ER and/or a variation (e.g., $3\sigma$) in ratios ER between a plurality of pulses and/or an error value (an error of the ratio ER with respect to a command value).

The processor 21 may calculate both the difference Ediff and ratio ER to cause the main controller 22 to confirm the light quality of the light source based on the difference Ediff and ratio ER.

The storage unit 25 of the exposure apparatus can record in advance a threshold value to determine the parameter (difference Ediff or ration ER). In decision step 103, 105, or 113, the main controller (evaluation unit) 22 compares the parameter with the determination threshold value. If the monitoring result of the light quality does not satisfy the required precision recorded in the exposure apparatus, the Error end process (108 or 115 in FIG. 5) or automatic restoration process (107 in FIG. 5), or the light quality lock sequence (104 in FIG. 5), is executed.

(Evaluation Method 3)

In evaluation method 3, the quality of light emitted by the light source 1 is evaluated based on the difference or average between the central wavelengths of a plurality of components of the spectrum of the light.

Evaluation method 3 will be explained by taking a spectrum including two components of the spectrum shown in FIG. 3 as an example. In the example shown in FIG. 3, $\lambda 0\text{-}1$ indicates the central wavelength of the component of the spectrum on the short-wavelength side, and $\lambda 0\text{-}2$ indicates the central wavelength of the component of the spectrum on the long-wavelength side.

It is possible to define the central wavelength of each component of a spectrum as, e.g., a wavelength representing the maximum light intensity of each component of the spectrum. Alternatively, the processor 21 may integrate the light intensity of each component of a spectrum from the short-wavelength side or long-wavelength side to define the central wavelength of each component of the spectrum as a wavelength at which the light intensity integrated value reaches half its maximum value.

The processor 21 calculates a difference $\Delta\lambda(=|\lambda 0\text{-}2 - \lambda 0\text{-}1|)$ between the central wavelengths of a plurality of components of a spectrum sent from each of the first measuring device 6 and/or second measuring device 19, and sends the calculated difference $\Delta\lambda$ to the main controller 22. The processor 21 may calculate a central position $\lambda 0$-center ($=\lambda 0\text{-}1 + (\Delta\lambda/2)$) between the two central wavelengths of the spectrum, and send the calculated central position $\lambda 0$-center to the main controller 22. The processor 21 can calculate the difference $\Delta\lambda$ or central position $\lambda 0$-center for each emission pulse.

The main controller 22 can confirm the light quality of the light source based on, e.g., the difference $\Delta\lambda$ and/or a variation (e.g., $3\sigma$) in differences $\Delta\lambda$ between a plurality of pulses and/or an error value (an error of the difference $\Delta\lambda$ with respect to a command value). Alternatively, the main controller 22 can confirm the light quality of the light source based on, e.g., the central position $\lambda 0$-center and/or a variation (e.g., $3\sigma$) in central positions $\lambda 0$-center between a plurality of pulses and/or an error value (an error of the central position $\lambda 0$-center with respect to a command value).

The processor 21 may calculate both the difference $\Delta\lambda$ and central position $\lambda 0$-center to cause the main controller 22 to confirm the light quality of the light source based on the difference Δλ and central position λ0-center.

The storage unit 25 of the exposure apparatus can record in advance a threshold value to determine the parameter (difference Δλ or central position λ0-center). In decision step 103, 105 or 113, the main controller (evaluation unit) 22 compares the parameter with the determination threshold value. If the monitoring result of the light quality does not satisfy the required precision recorded in the exposure apparatus, the Error and process (108 or 115 in FIG. 5) or automatic restoration process (107 in FIG. 5), or the light quality lock sequence (104 in FIG. 5) is executed.

(Evaluation Method 4)

In evaluation method 4, the quality of light emitted by the light source 1 is evaluated based on the FWHM of each component of the spectrum of the light. The FWHM of each component of a spectrum is defined as the width (bandwidth) of each component of a spectrum at a light intensity of half the peak light intensity of each component of the spectrum.

In the spectrum of light including two components of a spectrum, as illustrated in FIG. 3, FWHM-1 indicates the FWHM of the component of the spectrum on the short-wavelength side, and FWHM-2 indicates the FWHM of the component of the spectrum on the long-wavelength side.

The processor 21 calculates the FWHMs of a plurality of components of a spectrum sent from each of the first measuring device 6 and/or second measuring device 19, and sends the calculated FWHMs to the main controller 22. The processor 21 can calculate the FWHM of each component of the spectrum for each emission pulse.

The main controller 22 can confirm the light quality of the light source by evaluating the FWHM, a variation ($3\sigma$) in FWHMs between a plurality of pulses, and/or an error value (an error of the FWHM with respect to a command value) of each component of the spectrum.

The storage unit 25 of the exposure apparatus can record in advance a threshold value to determine the parameter (FWHM). In decision step 103, 105, or 113, the main controller (evaluation unit) 22 compares the parameter with the determination threshold value. If the monitoring result of the light quality does not satisfy the required precision recorded in the exposure apparatus, the Error end process (108 or 115 in FIG. 5) or automatic restoration process (107 in FIG. 5), or the light quality lock sequence (104 in FIG. 5) is executed.

(Evaluation Method 5)

In evaluation method 5, the quality of light emitted by the light source 1 is evaluated based on the E95 value of each component of the spectrum of the light. The E95 value of each component of the spectrum is defined as a bandwidth in which 95% of the entire energy of a spectral component (a component of a spectrum) is concentrated.

As illustrated in FIG. 3, in the spectrum of light including two components (peaks) of the spectrum, E95-1 indicates the E95 value of the component of the spectrum on the short-wavelength side, and E95-2 indicates the E95 value of the component of the spectrum on the long-wavelength side.

The processor 21 calculates the E95 values of a plurality of components of a spectrum sent from each of the first measuring device 6 and/or second measuring device 19, and sends the calculated E95 values to the main controller 22. The processor 21 can calculate the E95 value of each component of the spectrum for each emission pulse.

The main controller 22 can confirm the light quality of the light source by evaluating the E95 value, a variation ($3\sigma$) in E95 values between a plurality of pulses, and/or an error value (an error of the E95 value with respect to a command value) of each component of the spectrum.

The storage unit 25 of the exposure apparatus can record in advance a threshold value to determine the parameter (E95 value). In decision step 103, 105, or 113, the main controller (evaluation unit) 22 compares the parameter with the determination threshold value. If the monitoring result of the light quality does not satisfy the required precision recorded in the exposure apparatus, the Error and process (108 or 115 in FIG. 5) or automatic restoration process (107 in FIG. 5), or the light quality sequence (104 in FIG. 5), is executed.

(Evaluation Method)

In evaluation method 6, the quality of light emitted by the light source 1 is evaluated based on the sum total of energy of each component of the spectrum of the light. The sum total of energy of each component of a spectrum indicates a value obtained by integrating the light intensity of each component of a spectrum.

In the spectrum of light including two components of the spectrum as illustrated in FIG. 3, Σenergy-1 indicates a sum total of energy Σenergy of the component of the spectrum on the short-wavelength side, and Σenergy-2 indicates a sum total of energy Σenergy of the component of the spectrum in the long-wavelength side.

The processor 21 calculates sum totals of energy Σenergy of a plurality of components of a spectrum sent from each of the first measuring device 6 and/or second measuring device 19, and sends the calculated sum totals of energy Σenergy to the main controller 22. The processor 21 can calculate the sum total of energy Σenergy of each component of the spectrum for each emission pulse.

The main controller 22 evaluates the sum total of energy Σenergy, a variation ($3\sigma$) in sum totals of energy Σenergy between a plurality of pulses, and/or an error value (an error of the sum total of energy Σenergy with respect to a command value) of each component of the spectrum. This makes it possible to confirm the light quality of the light source.

The storage unit 25 of the exposure apparatus can record in advance a threshold value to determine the parameter (sum total of energy Σenergy). In decision step 103, 105, or 113, the main controller (evaluation unit) 22 compares the parameter with the determination threshold value. If the monitoring result of the light quality does not satisfy the required precision recorded in the exposure apparatus, the Error end process (108 or 115 in FIG. 5) or automatic restoration process (107 in FIG. 5), or the light quality lock sequence (104 in FIG. 5) is executed.

It is possible to calculate, for each emission pulse (window size=1), the variation ($3\sigma$) and the error value (an error component with respect to a command value) of each of the above-described parameters. Alternatively, a movement averaging process may be done with a window size conforming to an actual exposure condition to calculate the variation ($3\sigma$) and the error value (an error component with respect to a command value).

The window size at the time of scanning exposure is calculated by an oscillation frequency F of the light source and a scan velocity V of the stage, and indicates the number of pulses of exposure light, which irradiates one point of the wafer.

$$\text{window size} = F/V [\text{pulse/mm}] \quad (7)$$

At least two out of evaluation methods 1 to 6 described above may be used at the same time to confirm the light quality of the light source.

The parameters (evaluation indices) employed in evaluation methods 1 to 6 may be calculated for each light pulse or calculated after integrating spectra corresponding to a plurality of lenses.

According to the preferred embodiment of the present invention, it is possible to perform exposure or calibration after confirming a light quality necessary for substrate exposure or apparatus calibration even when light in use includes a plurality of components of a spectrum.

It is also possible to promptly perform an automatic restoration process even when the light quality degrades during substrate exposure or apparatus calibration, because the exposure apparatus can immediately detect a failure in exposure/calibration. This makes it possible to minimize the downtime of the exposure apparatus.

Figure 8:
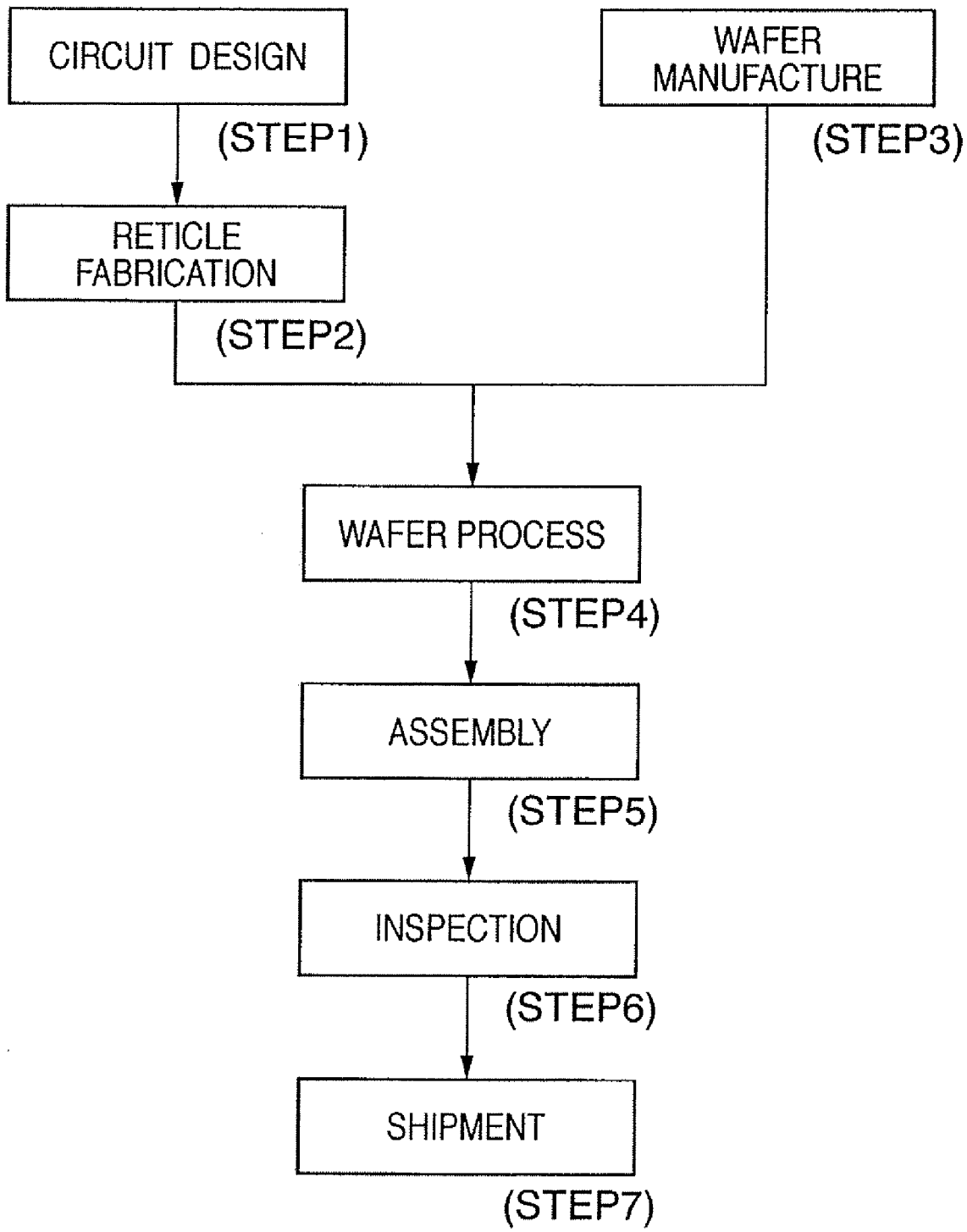
FIG. 8 is a flowchart illustrating a device manufacturing method.

A device manufacturing process using the above-described exposure apparatus will be described next. FIG. 8 is a flowchart illustrating the sequence of the overall semiconductor device manufacturing process. In step 1 (circuit design), the circuit of a semiconductor device is designed. In step 2 (reticle fabrication), a reticle (also called an original or a mask) is fabricated based on the designed circuit pattern. In step 3 (wafer manufacture), a wafer (also called a substrate) is manufactured using a material such as silicon. In step 4 (wafer process), called a preprocess, an actual circuit is formed on the wafer by lithography using the reticle and wafer. In step 5 (assembly), called a post-process, a semiconductor chip is formed using the wafer manufactured in step 4. This step includes processes such as assembly (dicing and bonding) and packing (chip encapsulation). In step 6 (inspection), inspections including an operation check test and a durability test of the semiconductor device manufactured in step 5 are performed. A semiconductor device is completed with these processes and shipped in step 7.

Figure 9:
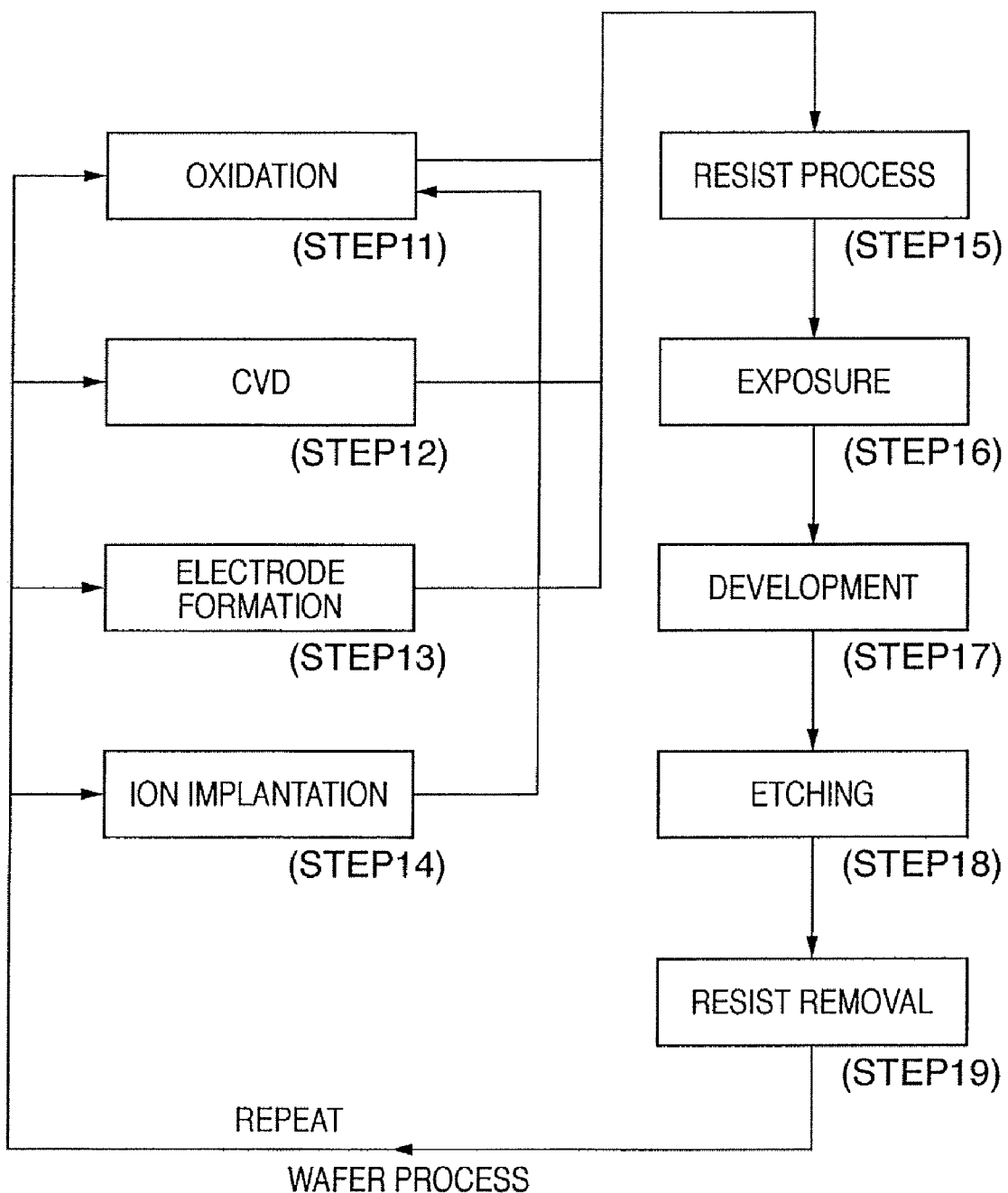
FIG. 9 is a flowchart illustrating the device manufacturing method.

FIG. 9 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the above-described exposure is used to form a latent image pattern on the resist by exposing the wafer coated with the photosensitive agent to light via the mask on which the circuit pattern is formed. In step 17 (development), the resist transferred onto the wafer is developed to form a resist pattern. In step 18 (etching), the layer or substrate under the resist pattern is etched through a portion where the resist pattern opens. In step 19 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to be accorded the broadest interpretation so as to encompass all such modifications and equivalent structures and functions.

What is claimed is:

1. An exposure apparatus for performing exposure of an object to light, said apparatus comprising:
   a measuring device configured to measure a wavelength spectrum of the light;
   a processor configured to calculate a center wavelength of light based on the measured wavelength spectrum; and
   a main controller configured to determine whether the exposure is to be performed, based on the calculated center wavelength of the light,
   wherein the wavelength spectrum includes a first spectral component and a second spectral component, and
   said processor is configured to calculate the center wavelength of the light $\lambda 0$ in accordance with:

$\lambda 0 = \lambda 0\text{-}1 + \Delta\lambda \times (\Delta\lambda\_A/(\Delta\lambda\_A + \Delta\lambda\_B))$, and $\Delta\lambda\_A : \Delta\lambda\_B = \text{Energy-2} : \text{Energy-1}$, where $\lambda 0\text{-}1$ is a center wavelength of the first spectral component, $\lambda 0\text{-}2$ ($\lambda 0\text{-}2 > \lambda 0\text{-}1$) is a center wavelength of the second spectral component, Energy-1 is a peak light intensity of the first spectral component, Energy-2 is a peak light intensity of the second spectral component, and $\Delta\lambda = \lambda 0\text{-}2 - \lambda 0\text{-}1$.

2. A method of manufacturing a device, said method comprising the steps of:
   exposing a substrate to light using an exposure apparatus as defined in claim 1;
   developing the exposed substrate; and
   processing the developed substrate to manufacture the device.

3. An exposure apparatus for performing exposure of an object to light, said apparatus comprising:
   a measuring device configured to measure a wavelength spectrum of the light;
   a processor configured to calculate a center wavelength of the light based on the measured wavelength spectrum; and
   a main controller configured to determine whether the exposure is to be performed, based on the calculated center wavelength of the light,
   wherein the wavelength spectrum includes a first spectral component and a second spectral component, and
   said processor is configured to calculate the center wavelength of the light $\lambda 0$ in accordance with:

$\lambda 0 = \lambda 0\text{-}1 + \Delta\lambda \times (\Delta\lambda\_A/(\Delta\lambda\_A + \Delta\lambda\_B))$, and $\Delta\lambda\_A) : \Delta\lambda\_B = \Sigma\text{Energy-2} : \Sigma\text{Energy-1}$, wherein $\lambda 0\text{-}1$ is a center wavelength of the first spectral component, $\lambda 0\text{-}2$ ($\lambda 0\text{-}2 > \lambda 0\text{-}1$) is a center wavelength of the second spectral component, $\Sigma$Energy-1 is a total sum of light intensities of the first spectral component, $\Sigma$Energy-2 is a total sum of light intensities of the second spectral component and $\Delta\lambda = \lambda 0\text{-}2 - \lambda 0\text{-}1$.

4. A method of manufacturing a device, said method comprising steps of:
   exposing a substrate to light using an exposure apparatus as defined in claim 3;
   developing the exposed substrate; and
   processing the developed substrate to manufacture the device.

* * * * *